United States Patent
Yang et al.

(10) Patent No.: US 6,255,809 B1
(45) Date of Patent: Jul. 3, 2001

(54) METHOD FOR MEASURING CAPACITANCE OF PASSIVE DEVICE REGION

(75) Inventors: Sheng-Hsing Yang; Yih-Jau Chang, both of Hsinchu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/327,895

(22) Filed: Jun. 8, 1999

(30) Foreign Application Priority Data

May 14, 1999 (TW) ................................................ 88107843

(51) Int. Cl.[7] .................................................. G01R 27/26
(52) U.S. Cl. ........................ 324/158.1; 324/658; 324/662
(58) Field of Search ................. 324/537, 158 R, 324/765, 519, 522, 523, 658, 662

(56) References Cited

U.S. PATENT DOCUMENTS 5,059,897 * 10/1991 Aton et al. ...................... 324/158 R

* cited by examiner

*Primary Examiner*—Safet Metjahic
*Assistant Examiner*—Paresh Patel
(74) *Attorney, Agent, or Firm*—Martine & Penilla, LLP

(57) ABSTRACT

A method for measuring a capacitance of a passive device region. The passive device region is formed on a substrate having a conductive type different from that of the passive device region. Two bias voltages are applied to two terminals of the passive device region. By measuring the distance between these two terminals and the width of the passive device region, plus the grading coefficients of both area effect and sidewall effect, capacitance induced at both terminals can be derived.

4 Claims, 1 Drawing Sheet

METHOD FOR MEASURING CAPACITANCE OF PASSIVE DEVICE REGION

BACKGROUND OF THE INVENTION

1. Field of the Invention

The invention relates to a method for measuring a capacitance, and more particularly, to a method for measuring a capacitance of a passive device region while being applied two bias voltages at two different terminals thereof.

2. Description of the Related Art

While applying a bias to a passive device region, a resistance-capacitance (RC) effect occurs. Based on the conventional measuring method, the capacitance is constant. In normal application, the actual magnitude of capacitance does not vary a lot with the applied bias. However, in analog application or high frequency operation, a precise measurement of the capacitance is required to monitor the behavior of RC component, the conventional method cannot achieve the objective.

SUMMARY OF THE INVENTION

The invention provides a method for measuring a capacitance of a passive device. A passive device region formed on a substrate is provided. A capacitance per unit area Cj and a capacitance per unit sidewall Cjsw of the passive device region are measured while an applied bias to the passive device region is 0V. An internal voltage PB of the substrate under an area effect and an internal voltage PBsw of the substrate under a sidewall effect are measured. A first bias voltage Vd1 is applied to a first terminal of the passive device region and a second bias voltage Vd2 is applied to a second terminal of the passive device region. A distance L between the first and the second terminals and a width W of the passive device region are measured. A first and a second capacitance Cin and Cout induced at the first and the second terminals are derived from the following equations:

$$Cin = Cj(1-Vd1/PB)^{-Mj} \cdot (\tfrac{1}{2}L \cdot W) + Cjsw(1-Vd1/PBsw)^{-Mjsw} \cdot (L+W);$$

and $$Cout = Cj(1-Vd2/PB)^{-Mj} \cdot (\tfrac{1}{2}L \cdot W) + Cjsw(1-Vd2/PBsw)^{-Mjsw} \cdot (L+W).$$

The invention provides a method for measuring a capacitance of a passive device region. As the applied bias and the dimensions of area and sidewall change, the induced capacitance is consequently changed to exactly reflect the behavior of RC component.

It is to be understood that both the foregoing general description and the following detailed description are exemplary and explanatory only and are not restrictive of the invention, as claimed.

DESCRIPTION OF THE PREFERRED EMBODIMENTS

Figure 1:
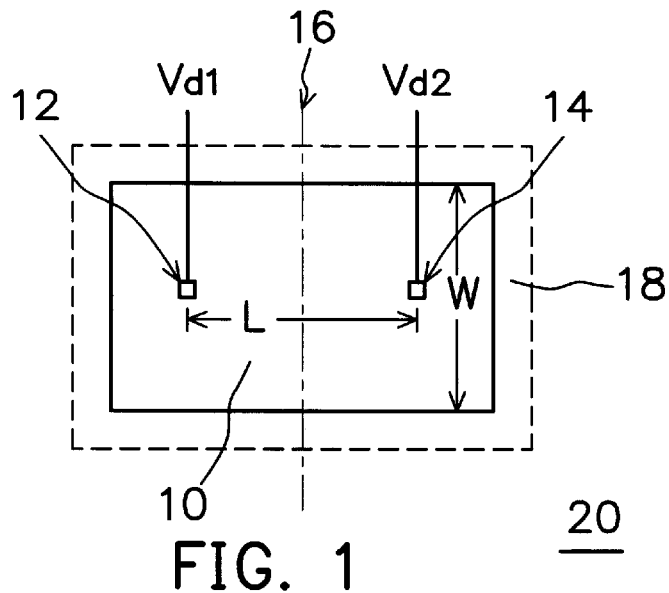
FIG. 1 shows a top view of passive device region including a depletion region on a substrate.

In FIG. 1, a top view of a passive device is shown. The passive device region 10 is formed on a substrate 20. The passive device region comprises an N-well while a P-type substrate is in use. Or alternatively, the passive device region 10 can be a P-well formed on an N-type substrate. The passive device region 10 has two terminal 12 and 14. While a first bias Vd1 is applied to the first terminal 12 and a second bias VD2 is applied to the second terminal 14, a depletion region 18 is formed at a junction between the passive device region 10 and the substrate 20. As shown in FIG. 1, the depletion region 18 is encompassed by the solid line and the dash line.

Figure 2:
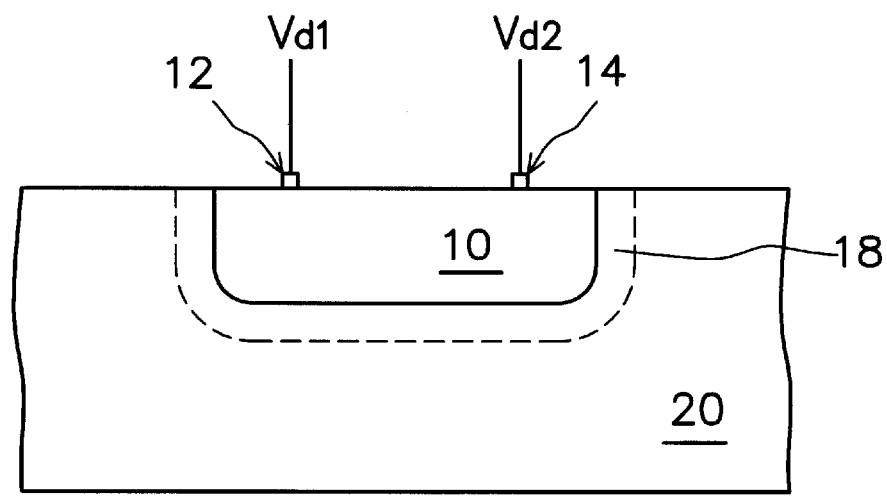
FIG. 2 shows a cross sectional view of the passive device region including the depletion region on the substrate as shown in FIG. 1.

A cross sectional view of the passive device region 10 including the depletion region 18 is shown in FIG. 2. Capacitance properties are induced on the depletion region 18. Considering the capacitance properties caused by area effect, a effective capacitance per unit area can be modified as $Cjeff = Cj(1-Vd/PB)^{-Mj}$, wherein Cj is a capacitance per unit area while an applying bias is 0V; Mj is a grading coefficient of area effect; and PB is an internal voltage of the substrate 20 under the area effect. The grading coefficient Mj can be obtained empirically, while the derivation of the internal voltage PB is known to those skilled in the art, so that a detailed description is not given here. In addition, a sidewall effect may also affect the magnitude of the capacitance. Therefore, the effective capacitance under the consideration of the sidewall effect can be modified as $Cjsweff = Cjsw(1-Vd/PBsw)^{-Mjsw}$, wherein Cjsw is the capacitance per unit sidewall, Mjsw is the grading coefficient of the sidewall effect, and PBsw is the internal voltage of the substrate 20 for the sidewall effect. Again, the sidewall grading coefficient Mjsw is an empirical value, while the magnitude of the substrate internal voltage PBsw can be derived by a conventional method.

The capacitance measuring method of a passive device region is based on both the consideration of area effect and sidewall effect. The capacitance per unit area Cj and capacitance per unit sidewall Cjsw are measured with an applied bias of 0V. The internal voltages PB and PBsw are derived using conventional method. On the first terminal 12 and the second terminal 14, a first bias voltage Vd1 and a second bias voltage Vd2 are applied. The distance L between the first terminal 12 and the second terminal 14 and the width of the passive device region W are measured. For example, as shown in FIG. 1, using a central line 16 of the first and the second terminals 12 and 14 as a reference, the effective area and effective sidewall for both these two terminals are ½L·W and L+W (½L+½L+W), respectively. In this example, the width is measured along a direction perpendicular to the central line 16.

Figure 3:
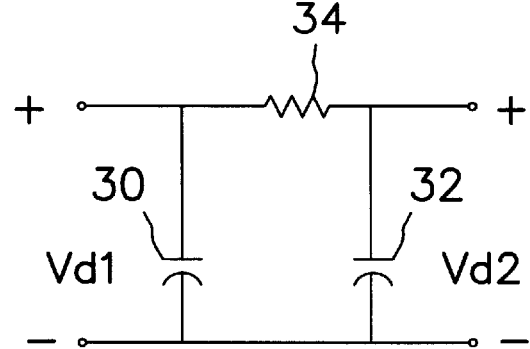
FIG. 3 shows an equivalent circuit of the capacitance and resistance induced in the passive device region.

FIG. 3 shows an equivalent circuit of the capacitance and resistance induced in the passive device region. The equivalent circuit comprises a first capacitor Cin 30 induced at the first terminal 12, a second capacitor Cout 32 induced at the second terminal 14, and a resistor 34 induced between two terminals 12 and 14.

Adding the consideration of area effect and sidewall effect into the modified equations to derive the capacitance, the capacitance of the first capacitor can be obtained from the following equation:

$$Cin = Cj(1-Vd1/PB)^{-Mj} \cdot (\tfrac{1}{2}L \cdot W) + Cjsw(1-Vd1/PBsw)^{-Mjsw} \cdot (L+W).$$

The capacitance of the second capacitor can be obtained from the following equation:

$$Cout = Cj(1-Vd2/PB)^{-Mj} \cdot (\tfrac{1}{2}L \cdot W) + Cjsw(1-Vd2/PBsw)^{-Mjsw} \cdot (L+W).$$

According to the measuring method provided in the invention, the capacitance is modified to be dependent on the applied bias voltage. Moreover, while the area or sidewall of the passive device region changes, the resultant capacitance is varied. Therefore, the magnitude of the induced capacitance can be derived more exactly. Consequently, the behavior of RC components can be monitored more precisely, so that the invention can be applied to practical use in analog applications or high frequency operation.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of measuring a capacitance of a passive device region on a substrate, comprising:

measuring a capacitance per unit area Cj and a capacitance per unit sidewall Cjsw of the passive device region while an applied bias to the passive device region is 0V;

measuring an internal voltage PB of the substrate under an area effect and an internal voltage PBsw of the substrate under a sidewall effect;

applying a first bias voltage Vd1 to a first terminal of the passive device region and a second bias voltage Vd2 to a second terminal of the passive device region;

measuring a distance L between the first and the second terminals and a width W of the passive device region; and deriving a first capacitance Cin induced at the first terminal from $$Cin=Cj(1-Vd1/PB)^{-Mj}\cdot(\tfrac{1}{2}L\cdot W)+Cjsw(1-Vd1/PBsw)^{-Mjsw}\cdot(L+W),$$

and deriving a second capacitance Cout induced at the second terminal from $$Cout=Cj(1-Vd2/PB)^{-Mj}\cdot(\tfrac{1}{2}L\cdot W)+Cjsw(1-Vd2/PBsw)^{-Mjsw}\cdot(L+W).$$

2. The method according to claim 1, wherein the passive device region comprises an N-well, while the substrate comprises a P-type substrate.

3. The method according to claim 1, wherein the passive device region comprises a P-well, while the substrate comprises an N-type substrate.

4. A method of measuring a capacitance of a passive device, comprising:

providing a passive device region formed on a substrate, wherein the passive region has a conductive type opposite to that of the substrate, so that a depletion region is formed at a junction between the passive device region and the substrate;

selecting a first terminal and a second terminal of the passive device region;

measuring a distance L between the first terminal and the second terminal;

measuring a width W of the passive device region in a direction perpendicular to that of the distance L;

measuring a capacitance per unit area Cj and a capacitance per unit sidewall Cjsw of the passive device region while an applied bias to the passive device region is 0V;

measuring an internal voltage PB of the substrate under an area effect and an internal voltage PBsw of the substrate under a sidewall effect;

applying a first bias voltage Vd1 to the first terminal of the passive device region and a second bias voltage Vd2 to the second terminal of the passive device region; and deriving a first capacitance Cin induced at the first terminal from $$Cin=Cj(1-Vd1/PB)^{-Mj}\cdot(\tfrac{1}{2}L\cdot W)+Cjsw(1-Vd1/PBsw)^{-Mjsw}\cdot(L+W),$$

and deriving a second capacitance Cout induced at the second terminal from $$Cout=Cj(1-Vd2/PB)^{-Mj}\cdot(\tfrac{1}{2}L\cdot W)+Cjsw(1-Vd2/PBsw)^{-Mjsw}\cdot(L+W).$$

* * * * *